(12) United States Patent
Ohse et al.

(10) Patent No.: US 10,453,923 B2
(45) Date of Patent: Oct. 22, 2019

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Naoyuki Ohse, Tsukuba (JP); Mina Ryo, Tsukuba (JP); Takuya Komatsu, Kofu (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/421,603

(22) Filed: Feb. 1, 2017

(65) Prior Publication Data

US 2017/0271456 A1 Sep. 21, 2017

(30) Foreign Application Priority Data

Mar. 16, 2016 (JP) .................................. 2016-053122
Mar. 16, 2016 (JP) .................................. 2016-053124

(51) Int. Cl.
*H01L 29/16* (2006.01)
*H01L 29/66* (2006.01)
(Continued)

(52) U.S. Cl.
CPC ...... *H01L 29/1608* (2013.01); *H01L 21/0485* (2013.01); *H01L 29/1087* (2013.01);
(Continued)

(58) Field of Classification Search
CPC ... H01L 29/1608; H01L 29/78; H01L 29/456; H01L 29/66068; H01L 29/401;
(Continued)

(56) References Cited

U.S. PATENT DOCUMENTS 4,224,280 A * 9/1980 Takahama .............. G01N 27/12
338/34
5,869,901 A * 2/1999 Kusuyama ........ H01L 21/32051
257/763
(Continued)

FOREIGN PATENT DOCUMENTS

| JP | H07-176615 A | 7/1995 |
| JP | 2003-309124 A | 10/2003 |
| JP | 2012-129503 A | 7/2012 |

*Primary Examiner* — Mouloucoulaye Inoussa
(74) *Attorney, Agent, or Firm* — Rabin & Berdo, P.C.

(57) ABSTRACT

An interlayer insulating film is patterned, contact holes are formed, and in the contact holes, a source contact portion forming an ohmic contact with the silicon carbide body is formed. Thereafter, a titanium film and an aluminum wiring layer are continuously formed in this sequence on the interlayer insulating film and the source contact portion. At this time, the thickness of the titanium film is about 1.0 μm or less. Thereafter, by heat treatment for curing of a passivation film or heat treatment thereafter, the titanium film and the aluminum wiring layer react, generating a TiAl alloy film between the titanium film and the aluminum wiring layer. The thickness of the TiAl alloy film, for example, is kept to about 1 nm to 100 nm; and the TiAl alloy film and the source contact portion do not contact each other.

11 Claims, 4 Drawing Sheets

(51) Int. Cl.
*H01L 29/40* (2006.01)
*H01L 21/04* (2006.01)
*H01L 29/78* (2006.01)
*H01L 29/10* (2006.01)

(52) U.S. Cl.
CPC ...... *H01L 29/401* (2013.01); *H01L 29/66068* (2013.01); *H01L 29/78* (2013.01)

(58) Field of Classification Search
CPC ........... H01L 29/1095; H01L 21/02529; H01L 21/0485; H01L 23/26; H01L 29/7823; H01L 29/66477; H01L 29/45; H01L 29/7395
USPC ............................ 257/77, 339, 343; 438/586
See application file for complete search history.

(56) References Cited

U.S. PATENT DOCUMENTS

| | | | |
|---|---|---|---|
| 2012/0132912 A1 | 5/2012 | Suekawa et al. | |
| 2013/0062622 A1* | 3/2013 | Tsuchiya | H01L 29/7394 257/77 |
| 2013/0149853 A1* | 6/2013 | Horii | H01L 29/66477 438/586 |
| 2014/0299887 A1* | 10/2014 | Matocha | H01L 23/26 257/77 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application Nos. 2016-053122 filed on Mar. 16, 2016, and 2016-053124 filed on Mar. 16, 2016, the entire contents of which are incorporated herein by reference.

BACKGROUND OF THE INVENTION

1. Field of the Invention

The embodiments discussed herein relate to a silicon carbide semiconductor device and a method of manufacturing a silicon carbide semiconductor device.

2. Description of the Related Art

Silicon carbide (SiC) has high critical field strength and has been attracting attention as an optimal semiconductor material in low-loss power devices. An oxide film ($SiO_2$ film) may be formed by thermal oxidation on a semiconductor substrate using silicon carbide (hereinafter, silicon carbide substrate) and therefore, the development of power metal oxide semiconductor field effect transistors (MOSFETs) using an oxide film formed by thermal oxidation as a gate insulating film is advancing (for example, refer to Japanese Laid-Open Patent Publication No. 2012-129503).

At an interface of a silicon carbide substrate (hereinafter, $SiO_2$/SiC interface) and an oxide film formed by thermal oxidation, the interface state density (Dit) is high, the channel mobility decreases, and the ON-resistance increases. Therefore, methods of reducing the interface state density Dit of the $SiO_2$/SiC interface by forming an oxide film on a silicon carbide substrate by thermal oxidation in a nitrous oxide ($N_2O$) gas atmosphere or a nitric oxide (NO) gas atmosphere are being developed.

Formation of an oxide film that becomes a gate insulating film by thermal oxidation in a nitrous oxide or a nitric oxide gas atmosphere enables the interface state density Dit of the $SiO_2$/SiC interface to be made $2\times10^{12} cm^{-2} \cdot eV^{-1}$ or less and enables realization of high channel mobility. Therefore, in a MOSFET using silicon carbide (hereinafter, SiC-MOSFET), it is possible to form a metal oxide semiconductor (MOS) gate (an insulated gate of a metal oxide semiconductor) structure that uses a good quality oxide film as a gate insulating film.

Figure 6:
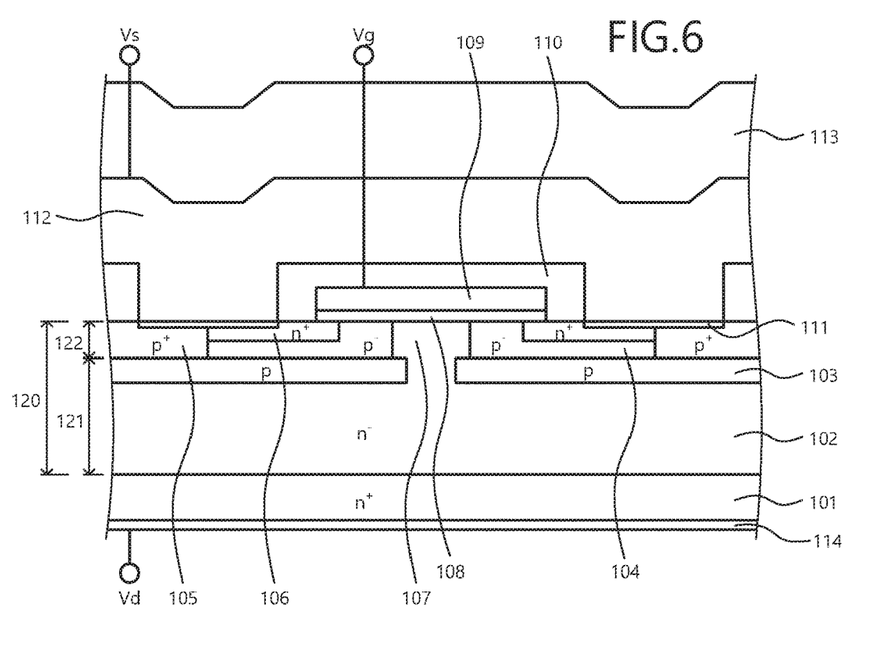
FIG. 6 is a cross-sectional view of an example of a silicon carbide semiconductor device manufactured by a traditional method of manufacturing a silicon carbide semiconductor device.

A traditional method of manufacturing a silicon carbide semiconductor device will be described taking a SiC-vertical MOSFET of a planar gate structure as an example. FIG. 6 is a cross-sectional view of an example of a silicon carbide semiconductor device manufactured by a traditional method of manufacturing a silicon carbide semiconductor device. First, on a front surface of an $n^+$-type silicon carbide substrate 101 that becomes an $n^+$-type drain region, an $n^-$-type silicon carbide layer 121 that becomes an $n^-$-type drift region 102 is formed by epitaxial growth. Next, p-type base regions 103 are selectively formed in a surface layer of the $n^-$-type silicon carbide layer 121 by ion implantation of a p-type impurity.

On the $n^-$-type silicon carbide layer 121, a $p^-$-type silicon carbide layer 122 that becomes a $p^-$-type base region 104 is formed by epitaxial growth. By the processes up to here, a silicon carbide base 120 constituted by the $n^+$-type silicon carbide substrate 101 and the silicon carbide layers 121, 122 is formed. Next, n-type regions 107 penetrating the $p^-$-type silicon carbide layer 122 in a depth direction are selectively formed by ion implantation. Subsequently, $n^+$-type source regions 106 and $p^+$-type contact regions 105 are selectively formed in the $p^-$-type silicon carbide layer 122 by ion implantation.

Heat treatment for activating the regions formed by ion implantation (hereinafter, activation annealing) is performed. Next, a gate insulating film 108 is formed by thermal oxidation in a nitrous oxide atmosphere. On the gate insulating film 108, a poly-silicon (poly-Si) layer that becomes a gate electrode 109 is formed. The poly-silicon layer is patterned and a portion covering from a portion of the $p^-$-type base region 104 between the $n^+$-type source region 106 and the n-type region 107 to the n-type region 107 is left. Next, an interlayer insulating film 110 is formed so as to cover the gate electrode 109.

Next, a nickel silicide film that becomes a source contact portion (electrically contacting portion) 111 contacting the $p^+$-type contact regions 105 and the $n^+$-type source regions 106 is formed, and a silicon carbide portion and the source contact portions 111 are caused to form an ohmic contact. On the entire base front surface, an aluminum wiring layer 112 that becomes a source electrode contacting the source contact portion 111 is formed to a thickness of 5 μm. A polyimide layer that becomes a passivation protective film 113 is formed on the aluminum wiring layer 112 and is hardened (cured). Thereafter, a drain electrode 114 is formed on a rear surface of the silicon carbide base 120 whereby the SiC-MOSFET depicted in FIG. 6 is completed.

Further, use of an oxide film that uses $N_2O.NO$ gas enables realization of high channel mobility where the interface state density is $2\times10^{12} cm^{-2} \cdot eV^{-1}$ or less, which has come to be considered a good quality structure as a gate insulating film of a SiC-MOSFET.

For example, as methods of forming wiring on the substrate of a semiconductor device, a technique of forming an aluminum (Al) material on a base of titanium (Ti) (for example, refer to Japanese Laid-Open Patent Publication No. H7-176615), a technique of having an alloy layer in a metal wiring layer of a pad, etc. (for example, refer to Japanese Laid-Open Patent Publication No. 2003-309124), and a technique of providing a barrier metal layer that suppresses the diffusion of aluminum between the source electrode and the interlayer insulating film, and between the gate pad and the gate electrode (for example, refer to Japanese Laid-Open Patent Publication No. 2012-129503) have been disclosed.

SUMMARY OF THE INVENTION

According to one aspect of the present invention, a silicon carbide semiconductor device includes an insulated gate structure having, as a gate insulating film, a silicon dioxide film that contacts a silicon carbide portion; an interlayer insulating film covering the insulated gate structure; a contact portion contacting the silicon carbide portion, forming an ohmic contact; a first metal film provided on a surface of the contact portion and the interlayer insulating film, the first metal film occluding or obstructing hydrogen; a metal electrode layer provided on a surface of the first metal film and electrically connected to the silicon carbide portion; and a second metal film provided between the first metal film and the metal electrode layer. The second metal film is positioned away from the contact portion.

In the silicon carbide semiconductor device, the first metal film covers the surface of the contact portion and the interlayer insulating film entirely.

In the silicon carbide semiconductor device, the first metal film has a thickness that is 10 nm to 1.0μm.

In the silicon carbide semiconductor device, a concentration of hydrogen molecules occluded in the first metal film is $1\times10^{16}/cm^2$ to $6\times10^{18}/cm^2$.

In the silicon carbide semiconductor device, the second metal film has a thickness of 1 nm to 100 nm.

In the silicon carbide semiconductor device, the metal electrode layer has a grain size of 100 nm or more.

In the silicon carbide semiconductor device, the first metal film is a titanium film, the metal electrode layer is an aluminum layer, and the second metal film is a metal film containing titanium and aluminum.

In the silicon carbide semiconductor device, the silicon carbide portion is constituted by a semiconductor substrate containing silicon carbide; a first semiconductor region of a first conductivity type and containing silicon carbide, the first semiconductor region provided on a front surface of the semiconductor substrate and having an impurity concentration that is lower than that of the semiconductor substrate; second semiconductor regions of a second conductivity type and containing silicon carbide, the second semiconductor regions provided on a first side of the first semiconductor region opposite a second side, the second side of the first semiconductor region facing the semiconductor substrate; and third semiconductor regions of the first conductivity type and selectively provided in the second semiconductor regions. The silicon carbide semiconductor device includes the gate insulating film provided contacting regions of the second semiconductor regions between the third semiconductor regions and first semiconductor regions; a gate electrode constituting the insulated gate structure and provided sandwiching the gate insulating film with the second semiconductor region; a first electrode formed by the metal electrode layer and electrically connected to the second semiconductor regions and the third semiconductor region; and a second electrode provided on a rear surface of the semiconductor substrate.

According to another aspect of the present invention, method of manufacturing a silicon carbide semiconductor device includes forming an insulated gate structure having, as a gate insulating film, a silicon dioxide film that contacts a silicon carbide portion; forming an interlayer insulating film covering the insulated gate structure; forming a contact portion contacting the silicon carbide portion to form an ohmic contact; forming a first metal film on a surface of the contact portion and the interlayer insulating film, the first metal film occluding or obstructing hydrogen; forming a metal electrode layer on a surface of the first metal film, the metal electrode layer being electrically connected to the silicon carbide portion; and heat treating after forming the metal electrode layer, so that the first metal film and the metal electrode layer react producing a second metal film between the first metal film and the metal electrode layer, and the first metal film remains between the second metal film and the interlayer insulating film and between the second metal film and the contact portion.

In the method of manufacturing a silicon carbide semiconductor device, the second metal film produced by the heat treating has a thickness of 1 nm to 100 nm.

In the method of manufacturing a silicon carbide semiconductor device, the first metal film remaining after the heat treating has a thickness of 10 nm to 1.0μm.

In the method of manufacturing a silicon carbide semiconductor device, the first metal film remaining after the heat treating has a concentration of occluded hydrogen $1\times10^{16}/cm^2$ to $6\times10^{18}/cm^2$.

In the method of manufacturing a silicon carbide semiconductor device, the heat treating is performed at a temperature of 450 degrees C. or less.

In the method of manufacturing a silicon carbide semiconductor device, the first metal film is a titanium film, the metal electrode layer is an aluminum layer, and the second metal film is a metal film containing titanium and aluminum.

According to yet another aspect of the present invention, a semiconductor device includes a silicon carbide substrate; a drain region on the silicon carbide substrate and of a first conductivity type; a well region on the silicon carbide substrate and of a second conductivity type; a source region on the silicon carbide substrate and of the first conductivity type; a gate electrode provided on the silicon carbide substrate, via a gate insulating film; and a source electrode contacting the gate electrode, via an interlayer film. The source electrode has a 3-layer structure of a titanium (Ti) layer/a titanium aluminum (Ti—Al) alloy layer/an aluminum (Al) layer. The Ti—Al alloy layer has a thickness of 5 nm to 100 nm. The Ti—Al alloy layer has, in an overall content of the Ti and the Al, an Al content of 25 atoms % to 86 atoms %.

In the semiconductor device, the silicon carbide substrate is an n-type, and the semiconductor device includes an n-type drift layer on the silicon carbide substrate; a p-type well layer provided on the n-type drift layer; an n-type source region provided in the p-type well layer; a gate insulating film formed on the p-type well layer; a gate electrode formed on the gate insulating film; a source electrode electrically connected to the n-type source region; and a drain electrode provided on a first surface of the silicon carbide substrate opposite a second surface on which the n-type drift layer is provided.

The semiconductor device has a MOSFET semiconductor device structure.

In the semiconductor device, the Ti—Al alloy layer is one of $TiAl_6$, $TiAl_3$, TiAl, and $Ti_3Al$.

According to still another aspect of the present invention, a method of manufacturing a semiconductor device includes forming on silicon carbide substrate, a drain region of a first conductivity type, a well region of a second conductivity type, and a source region of the first conductivity type; forming a gate electrode on the silicon carbide substrate, via a gate insulating film; and forming a source electrode contacting the gate electrode, via an interlayer film. The source electrode is formed in a sequence of a titanium (Ti) layer/a titanium aluminum (Ti-Al) alloy layer/a aluminum (Al) layer by a sputtering process, and the silicon carbide substrate is annealed at a temperature of 300 degrees C. to 500 degrees C. after the source electrode is formed.

In the method of manufacturing a semiconductor device, the sputtering process of the Ti—Al alloy layer of the source electrode is performed at a sputtering pressure of 0.1 Pa to 0.8 Pa and a temperature of the silicon carbide substrate of 25 degrees C. to 350 degrees C., and a sputtering material has, in an overall content of the Ti and the Al, an Al content of 25 atoms % to 86 atoms %.

In the method of manufacturing a semiconductor device, the source electrode is formed without exposing the Ti layer, the Ti—Al alloy layer, and the Al layer to an atmosphere in a same chamber.

In the method of manufacturing a semiconductor device, in the source electrode, a Ti—Al alloy newly generated beneath the Ti—Al alloy layer by heat treating after formation of the source electrode has a thickness of 10 nm or less.

In the method of manufacturing a semiconductor device, in the source electrode, after heat treating after formation of the source electrode, the Ti layer remains beneath the Ti—Al alloy layer and has a thickness of 10 nm or more.

In the method of manufacturing a semiconductor device, the sputtering material is one of $TiAl_6$, $TiAl_3$, TiAl, and $Ti_3Al$.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
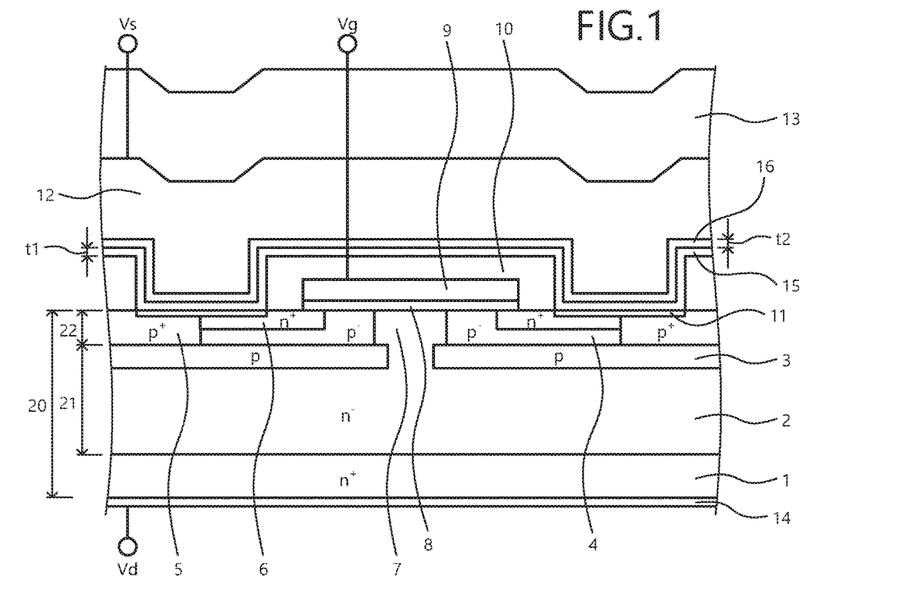
FIG. 1 is a cross-sectional view of a structure of a silicon carbide semiconductor device according to a first embodiment.

A structure of a silicon carbide semiconductor device according to an embodiment will be described taking a SiC-vertical MOSFET of a planar gate structure as an example. FIG. 1 is a cross-sectional view of a structure of a silicon carbide semiconductor device according to a first embodiment. In FIG. 1, an active region that bears driving current (region through which current flows in an on-state) is depicted for one unit cell (semiconductor element functional unit), and other unit cells arranged adjacent to this unit cell and an edge termination structure arranged in an edge termination region are omitted from the drawing. The edge termination region is a region that mitigates the electric field on a base front surface side of an n⁻-type drift region (first semiconductor region) 2 and maintains the breakdown voltage. A breakdown voltage structure, for example, may include a guard ring, a field plate, or RESURF, etc., or may be a structure combining these.

The silicon carbide semiconductor device according to the first embodiment depicted in FIG. 1 is a SiC-MOSFET that includes a MOS gate structure of a planar gate structure on a front surface side of a silicon carbide base (semiconductor chip) 20. The silicon carbide base 20 is formed by forming sequentially by epitaxial growth on a front surface of an n⁺-type supporting substrate (n⁺-type silicon carbide substrate) 1 that becomes an n⁺-type drain region, silicon carbide layers 21, 22 that become an n⁻-type drift region 2 and p⁻-type base region (second semiconductor region) 4. In a surface layer on the base front surface side (side opposite from an n⁺-type silicon carbide substrate 1 side) of the n⁻-type silicon carbide layer 21 that becomes the n⁻-type drift region 2, p-type base regions 3 are selectively provided. A portion of the n⁻-type silicon carbide layer 21 excluding the p-type base regions 3 is the n⁻-type drift region 2.

In the p⁻-type silicon carbide layer 22 that becomes the p⁻-type base region 4, an n-type region 7 that penetrates the p⁻-type silicon carbide layer 22 in a depth direction and reaches the n⁻-type drift region 2 is provided. In other words, the n-type region 7 faces, in the depth direction, a portion of the n⁻-type drift region 2 between adjacent p-type base regions 3. The n-type region 7 is a junction FET (JFET) region and functions as a drift region with the n⁻-type drift region 2. Further, in the p⁻-type silicon carbide layer 22, at portions facing the p-type base regions 3 in the depth direction, p⁺-type contact regions 5 and n⁺-type source regions (third semiconductor regions) 6 are each selectively formed away from the n-type region 7.

The p⁺-type contact regions 5 are arranged on a side of the n⁺-type source regions 6 opposite the side facing the n-type region 7, and contact the n⁺-type source regions 6. The p⁺-type contact regions 5 may penetrate the p⁻-type silicon carbide layer 22 in the depth direction and contact the p-type base regions 3. Portions of the p⁻-type silicon carbide layer 22 excluding the p⁺-type contact regions 5, the n⁺-type source regions 6, and the n-type region 7 are the p⁻-type base regions 4. On the p⁻-type base regions 4 at a portion of between the n-type region 7 and the n⁺-type source regions 6, a gate insulating film 8 is provided that passes over the n-type region 7.

The gate insulating film 8 is a silicon dioxide ($SiO_2$) film formed by thermal oxidation of a front surface (the p⁻-type base region 4 side) of the silicon carbide base 20. A gate electrode 9 is provided on the gate insulating film 8. The gate electrode 9 is fixed at a gate potential Vg. The p-type base regions 3, the p⁻-type base regions 4, the p⁺-type contact regions 5, the n⁺-type source regions 6, the n-type region 7, the gate insulating film 8, and the gate electrode 9 constitute the MOS gate structure.

An interlayer insulating film 10 is provided on the entire front surface of the silicon carbide base 2 and covers the gate electrode 9. In contact holes that penetrate the interlayer insulating film 10 in the depth direction, a source contact portion 11 contacting the p⁺-type contact region 5 and the n⁺-type source region 6 is provided. The source contact portions 11, for example, are metal films formed by converting nickel (Ni) into a silicide (NiSi) and each forms an ohmic contact with the silicon carbide base 20. The source contact portions 11 are insulated from the gate electrode 9 by the interlayer insulating film 10.

On the source contact portions 11, a titanium (Ti) film (first metal film) 15 is provided on the entire surface of each of the source contact portions 11. The titanium film 15 extends along the surface of the interlayer insulating film 10 and side walls of the contact holes, and covers the entire surface of the interlayer insulating film 10. The titanium film 15 is insulated from the gate electrode 9 by the interlayer insulating film 10. The titanium film 15 has a function of occluding (storing) hydrogen (H) atoms/hydrogen ions generated from inside an aluminum wiring layer 12 and obstructing the hydrogen (H) atoms/hydrogen ions from reaching the interlayer insulating film 10.

The titanium film 15 has a thickness t1, for example, that may be preferably about 10 nm or more. The reason for this is that when the thickness t1 of the titanium film 15 is less than 10 nm, the occlusion effect of hydrogen atoms/hydrogen ions by the titanium film 15 is not obtained. The concentration of the hydrogen molecules ($H_2$) occluded in the titanium film 15, for example, is about $1 \times 10^{16}/cm^2$ or higher. The hydrogen atoms/hydrogen ions are particles having hydrogen atoms as the smallest constituent unit and in particular, are hydrogen atoms, hydrogen ions, and hydrogen molecules.

On the titanium film 15, an alloy layer (hereinafter, TiAl alloy film (second metal film)) 16 including titanium and aluminum (Al) is provided along the surface of the titanium film 15. The TiAl alloy film 16 is, for example, a $TiAl_3$ film formed by a reaction of the titanium film 15 and the aluminum wiring layer 12 during the manufacture of the silicon carbide semiconductor device. The TiAl alloy film 16 does not contact the source contact portion 11 consequent to the titanium film 15 present between the TiAl alloy film 16 and the source contact portion 11. The TiAl alloy film 16 has a thickness that, for example, may be preferably about 1 nm or more and 100 nm or less. The reason for this is that the titanium film 15 is not entirely replaced by the TiAl alloy film 16 and has a thickness that may be formed by heat treatment at a suitable temperature of 450 degrees C. or lower after formation of the aluminum wiring layer 12.

On the TiAl alloy film 16, an aluminum wiring layer (metal electrode layer) 12 is provided. The aluminum wiring layer 12 is fixed at a source potential Vs. A grain size of the aluminum wiring layer 12, for example, may be preferably about 100 nm or more. The reason for this is described hereinafter. In this manner, the source contact portion 11, the titanium film 15, the TiAl alloy film 16, and the aluminum wiring layer 12 are sequentially stacked on the front surface of the silicon carbide base 20. The source contact portion 11, the titanium film 15, the TiAl alloy film 16, and the aluminum wiring layer 12 are a metal wiring layer functioning as a source electrode (first electrode).

On the aluminum wiring layer 12, for example, a polyimide layer that becomes a passivation protective film 13 that protects the front surface of the silicon carbide base 20 is provided. A rear electrode (second electrode) 14 is provided on the entire rear surface (rear surface of the $n^+$-type silicon carbide substrate 1) of the silicon carbide base 20. The rear electrode 14 is fixed at a drain potential Vd.

Figure 2:
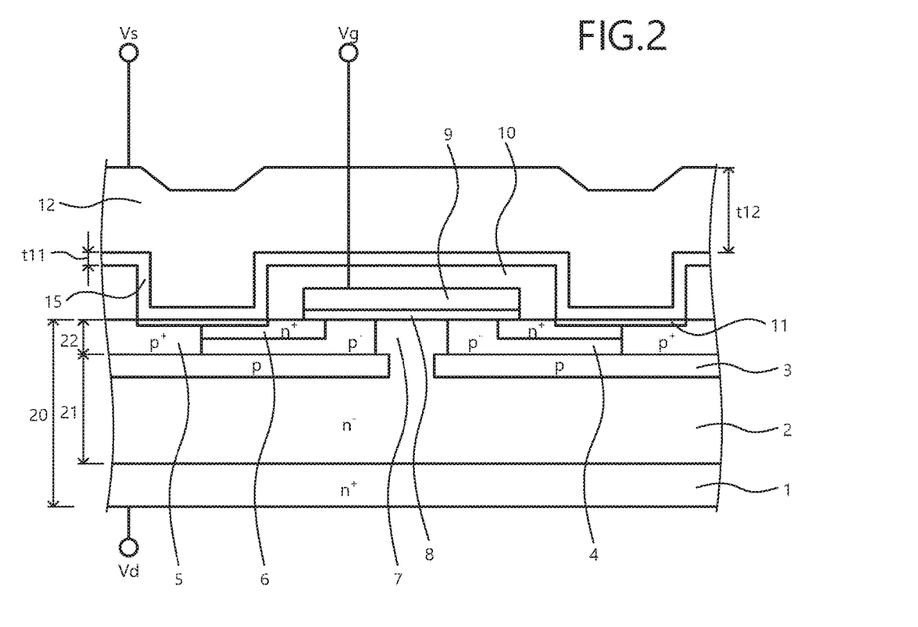
FIGS. 2 and 3 are cross-sectional views of the silicon carbide semiconductor device during manufacture according to the first embodiment.
Figure 3:
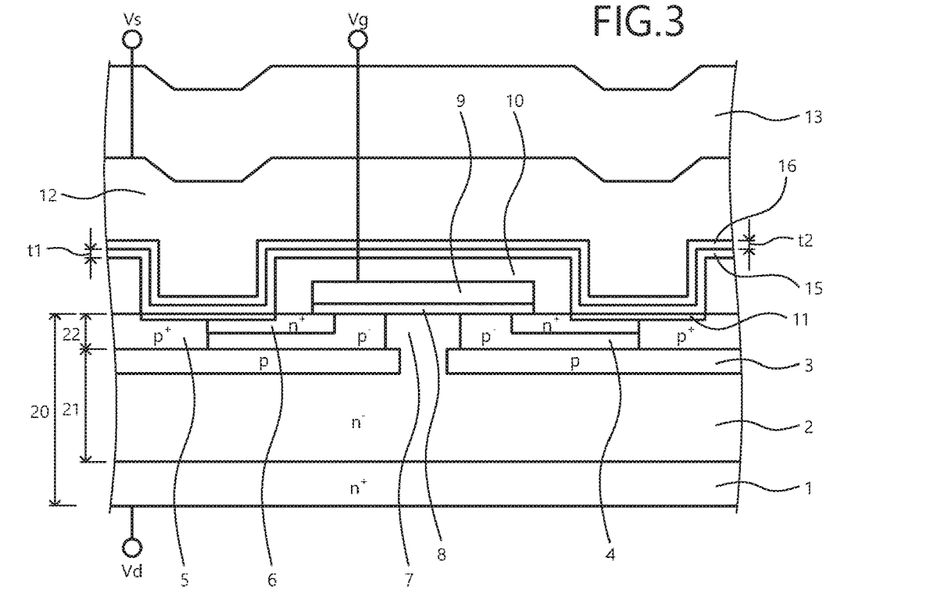

A method of manufacturing a silicon carbide semiconductor device according to the first embodiment will be described. FIGS. 2 and 3 are cross-sectional views of the silicon carbide semiconductor device during manufacture according to the first embodiment. First, the $n^+$-type silicon carbide substrate 1 that becomes the $n^+$-type drain region is prepared. The front surface of the $n^+$-type silicon carbide substrate 1, for example, may be a (000-1) plane, a so-called C plane. On the front surface of the $n^+$-type silicon carbide substrate 1, the $n^-$-type silicon carbide layer 21 doped with $5 \times 10^{15}/cm^3$ of nitrogen (N) is formed by epitaxial growth to a thickness of 10 µm.

The p-type base regions 3 are selectively formed in the surface layer of the $n^-$-type silicon carbide layer 21 by ion implantation of a p-type impurity. A portion of the $n^-$-type silicon carbide layer 21 excluding the p-type base regions 3 becomes the $n^-$-type drift region 2. Next, on the $n^-$-type silicon carbide layer 21, the $p^-$-type silicon carbide layer 22 doped with $5 \times 10^{15}/cm^3$ of aluminum is formed by epitaxial growth to a thickness of 0.5 µm and so as to cover the p-type base regions 3. By the processes up to here, an epitaxial substrate (hereinafter, the silicon carbide base 20) is formed where the silicon carbide layers 21, 22 are deposited (formed) on the $n^+$-type silicon carbide substrate 1.

Next, the $p^-$-type silicon carbide layer 22 is partially reversed (inverted to an n-type) by ion implantation of nitrogen and the n-type region 7 that penetrates the $p^-$-type silicon carbide layer 22 in the depth direction and reaches the $n^-$-type silicon carbide layer 21 is selectively formed. Next, the $n^+$-type source regions 6 are selectively formed in the $p^-$-type silicon carbide layer 22 by ion implantation of phosphorus (P). Subsequently, the $p^+$-type contact regions 5 are selectively formed in the $p^-$-type silicon carbide layer 22 by ion implantation of aluminum. The formation sequence of the $p^+$-type contact regions 5, the $n^+$-type source regions 6 and the n-type region 7 may be interchanged. Portions of the $p^-$-type silicon carbide layer 22 excluding the $p^+$-type contact regions 5, the $n^+$-type source regions 6, and the n-type region 7 become the $p^-$-type base regions 4.

Next, for example, activation annealing is performed at a temperature of about 1600 degrees C. in an argon (Ar) gas atmosphere and the p-type base regions 3, the $p^+$-type contact regions 5, the $n^+$-type source regions 6, and the n-type region 7 are activated. Next, for example, in a nitrous oxide ($N_2O$) gas atmosphere, the front surface (surface on the $p^-$-type base region 4 side) of the silicon carbide base 20 is thermally oxidized and the gate insulating film 8 having, for example, a thickness of 70 nm is formed. Formation of the gate insulating film 8 by thermal oxidation in a gas atmosphere including nitrous oxide or nitric oxide (NO) enables the interface state density Dit of the interface ($SiO_2$/SiC interface) of the gate insulating film 8 and the silicon carbide base 20 to be lowered, enabling high channel mobility to be realized.

Next, on the gate insulating film 8, poly-silicon (poly-Si) is deposited and patterned whereby poly-silicon forming the gate electrode 9 remains. Next, the interlayer insulating film 10 is formed on the entire front surface of the silicon carbide base 20 so as to cover the gate electrode 9. Next, the interlayer insulating film 10 and the gate insulating film 8 are patterned, contact holes are formed, and the $p^+$-type contact regions 5 and the $n^+$-type source regions 6 are exposed. Nickel films contacting the $p^+$-type contact regions 5 and the $n^+$-type source regions 6 are formed and converted to a silicide whereby the source contact portions 11 forming an ohmic contact with the silicon carbide base 20 are formed.

Next, for example, by magnetron sputtering in an argon gas atmosphere having a pressure of about 0.3 Pa, the titanium film 15 and the aluminum wiring layer 12 are continuously formed in this order on the interlayer insulating film 10 and the source contact portions 11. At this time, the thickness t11 of the titanium film 15 at the time of sputtering may be preferably, for example, about 1.0 µm or less. The reason for this is that since titanium is a hard metal, when the thickness t11 of the titanium film 15 at the time of sputtering is made thicker than 1.0 µm, cracks are generated in the titanium film 15. A further reason is that there is a possibility that the source contact portion 11 may not be covered in the contact holes. In particular, for example, the thicknesses t11, t12 of the titanium film 15 and the aluminum wiring layer 12 at the time of sputtering may be about 0.1 μm and about 5.0 μm, respectively. The state up to here is depicted in FIG. 2.

The sputtering for forming the titanium film 15 and the aluminum wiring layer 12 may be preferably performed by heating the silicon carbide base 20, for example, to a temperature of about 200 degrees C. or higher and 350 degrees C. or lower (substrate temperature). Reasons for this are as follows. When the substrate temperature at the time of sputtering is 200 degrees C. or lower, the grain size of the aluminum wiring layer 12 becomes less than 100 nm. In this case, voids are created in the aluminum wiring layer 12. Furthermore, coating defects occur such as the thickness t12 of the aluminum wiring layer 12 at the time of sputtering becoming thin at portions, the titanium film 15 becoming partially exposed without being covered by the aluminum wiring layer 12, etc. Also, when the substrate temperature at the time of sputtering is 350 degrees C. or higher, the alloy reaction between the titanium film 15 and the aluminum wiring layer 12 progresses excessively during the heat treatment described hereinafter and there is a possibility that the TiAl alloy film 16 may reach the source contact portion 11.

Next, the aluminum wiring layer 12 and the titanium film 15 are patterned and a metal wiring layer that becomes the source electrode is formed. Subsequently, a polyimide layer that is the passivation protective film 13 is deposited on the front surface of the silicon carbide base 20 and, for example, is hardened (cured) by heat treatment at a temperature of 350 degrees C. By the heat treatment for hardening the passivation protective film 13 or by heat treatment thereafter, alloying at the interface of the titanium film 15 and the aluminum wiring layer 12 progresses and the TiAl alloy film 16 is formed between the titanium film 15 and the aluminum wiring layer 12. At this time, the TiAl alloy film 16 has a thickness t2 such that the TiAl alloy film 16 does not reach the source contact portion 11, and the titanium film 15 remains across the entire surface between the TiAl alloy film 16 and the interlayer insulating film 10 and between the TiAl alloy film 16 and the source contact portion 11. The state up to here is depicted in FIG. 3.

In this manner, even when the TiAl alloy film 16 is formed between the aluminum wiring layer 12 and the titanium film 15, the titanium film 15 remains across the entire surface of the interlayer insulating film 10 and the source contact portion 11. The TiAl alloy film 16 does not reach the source contact portion 11 consequent to the titanium film 15 remaining between the TiAl alloy film 16 and the source contact portion 11. In particular, for example, the thickness t2 of the TiAl alloy film 16 is about 5 to 15 nm or less, and the thickness t1 of the titanium film 15 remaining after heat treatment is about 85 to 95 nm. Therefore, hydrogen atoms/hydrogen ions in the aluminum wiring layer 12 are occluded in the titanium film 15 below and do not move to layers (the silicon carbide base 20 side) below the titanium film 15. As a result, since hydrogen atoms/hydrogen ions in the aluminum wiring layer 12 do not diffuse to the gate insulating film 8, the gate insulating film 8 having a stable gate threshold voltage may be obtained.

Further, when the temperature of the heat treatment performed after the formation of the aluminum wiring layer 12 is 400 degrees or higher, the thickness t2 of the TiAl alloy film 16 becomes 50 nm or more, and when the temperature is 450 degrees C. or higher, the thickness t2 of the TiAl alloy film 16 becomes about 100 nm or more. Further, when the temperature of the heat treatment performed after the formation of the aluminum wiring layer 12 is about 350 degrees C., the thickness t2 of the TiAl alloy film 16 becomes 50 nm or less. As described, since it is preferable to keep the thickness t2 of the TiAl alloy film 16, for example, about 1 nm or more and 100 nm or less, the heat treatment performed after the formation of the aluminum wiring layer 12, for example, may be preferably about 450 degrees C. or lower.

Further, to obtain the occlusion effect of hydrogen atoms/hydrogen ions by the titanium film 15, the thickness t1 of the titanium film 15 remaining after heat treatment has to be about 10 nm or more as described above. Reasons for this are as follows. In a traditional SiC-MOSFET (refer to FIG. 6; hereinafter, traditional example) in which no titanium film is provided between the aluminum wiring layer 112 and the source contact portion 111, it was confirmed that under high-temperature operation of 200 degrees C. or higher, the junction temperature (junction) released $3 \times 10^{14}/cm^2$ or more hydrogen atoms/hydrogen ions. On the other hand, in the present invention it was confirmed that when the thickness t1 of the titanium film 15 remaining after heat treatment was 100 nm and hydrogen was injected at a temperature of about 400 degrees C., the concentration of hydrogen molecules occluded in the titanium film 15 was $6 \times 10^{17}/cm^2$. Therefore, when the thickness t1 of the titanium film 15 remaining after heat treatment is set to be about 10 nm, about $1 \times 10^{16}/cm^2$ hydrogen atoms/hydrogen ions are occluded in the titanium film 15 and thus, a margin 10 times the amount of hydrogen atoms/hydrogen ions released in the traditional example may be ensured. Accordingly, if the thickness t1 of the titanium film 15 remaining after heat treatment is not at least 10 nm or more, the occlusion effect of the hydrogen atoms/hydrogen ions is not sufficiently obtained. Further, as described, since the thickness t1 of the titanium film 15 before heat treatment may be preferably 1.0 μm or less, the concentration of hydrogen molecules to be occluded in the titanium film 15 may be preferably $6 \times 10^{18}/cm^2$ or less.

Thereafter, the rear electrode 14 is formed on the rear surface (rear surface of the n$^+$-type silicon carbide substrate) of the silicon carbide base 20 whereby the SiC-MOSFET depicted in FIG. 1 is completed.

As described above, according to the first embodiment, even when a TiAl alloy film between the titanium film and the aluminum wiring layer constituting the source electrode is formed by a history of heating, the titanium film remains between the interlayer insulating film and the aluminum wiring layer. Additionally, the titanium film remains between the TiAl alloy film and the contact portions without the TiAl alloy film and the contact portions being in direct contact. Therefore, hydrogen atoms/hydrogen ions generated from inside the aluminum wiring layer may be occluded/obstructed by the titanium film and prevented from moving to the SiO$_2$/SiC interface. As a result, at the time of positive voltage application and negative voltage application, variation of the gate threshold voltage is suppressed. Here, the thickness of the titanium film remaining at the layer beneath the aluminum wiring layer is 10 nm or more and 1.0 μm or less and the concentration of the hydrogen molecules occluded in the titanium film is $1 \times 10^{16}/cm^2$ or higher, enabling the generation of positive charge to the SiO$_2$/SiC interface by the hydrogen atoms/hydrogen ions to be prevented and thus, enabling a SiC-MOSFET having stabilized electrical characteristics to be provided.

A first comparison example will be described. In general, in a SiC-power MOSFET, high voltages of both positive voltage and negative voltage are applied to the gate electrode at the time of driving. Further, since SiC-power MOSFETs are subject to high temperature operation, guaranteed operation under high temperatures where the junction temperature becomes 200 degrees C. or higher is necessary. In particular, although guaranteed operation at a temperature of about 200 degrees C. and when the electric field strength applied to the gate insulating film is about ±2 MV/cm to ±4 MV/cm is necessary, in this case, under certain conditions, a phenomenon of the gate threshold voltage greatly varying has been observed.

Thus, electrical characteristics of the traditional example (refer to FIG. 6) described above were verified by a reliability test. Configuration of the traditional example, exclusive of the metal wiring layer functioning as a source electrode is the same as that of EXAMPLE described hereinafter. With respect to the traditional example, under high temperature operation where the operating temperature (junction temperature) is 200 degrees C., 3 MV/cm (positive voltage) and −3 MV/cm (negative voltage) were each applied for 10 minutes to the gate electrode 109 and the variation range of the gate threshold voltage was measured. The variation range of the gate threshold voltage is the difference from the gate threshold voltage (reference value) at the time of product shipment and determined based on design conditions.

Results confirmed that in the traditional example, when positive voltage is applied to the gate electrode 10, variation of the gate threshold voltage is minimal; the variation range (amount of variation) was ±0.1V or less. On the other hand, it was confirmed that when negative voltage is applied to the gate electrode 109, the gate threshold voltage varies greatly in the negative direction (i.e., gate threshold voltage decreases). This phenomenon of the gate threshold voltage varying in the negative direction indicates that consequent to the application of negative voltage to the gate electrode 109 under a high temperature atmosphere, positive charge (holes) are captured and charge near the SiO$_2$/SiC interface or in the gate insulating film 108, generating a positive fixed charge.

There are few reports of the phenomenon of the gate threshold voltage varying in the negative direction in Si-MOSFETs and Si-IGBTs (insulated gate bipolar transistors) using silicon (Si). Research for reducing the interface state density of the SiO$_2$/SiC interface is often carried out; however, there are no reports concerning a technique of reducing the interface state density of the SiO$_2$/SiC interface to about the interface state density of a SiO$_2$/Si interface.

For example, for Si-p channel type MOSFETs, the phenomenon (slow trap phenomenon) of the gate threshold voltage varying when negative voltage is applied to the gate electrode has been reported; however, the variation range of the gate threshold voltage is small. In particular, in a Si-p channel type MOSFET, even when a negative voltage of −3 MV/cm is applied to the gate electrode at an operating temperature of 150 degrees C. for 1000 hours, the variation range of the gate threshold voltage is 0.1V.

On the other hand, under the same conditions (operating temperature of 150 degrees C., a gate voltage of −3 MV/cm), the variation range of the gate threshold voltage of a SiC-MOSFET is large at −7V or higher. In particular, the interface state density of the SiO$_2$/Si interface of a Si-MOSFET is $1.0 \times 10^{11} \text{cm}^{-2} \text{eV}^{-1}$ or lower. On the other hand, since the interface state density of the SiO$_2$/SiC interface of a SiC-MOSFET is $1.0 \times 10^{12} \text{cm}^{-2} \text{eV}^{-1}$ or higher, positive fixed charge is found to be greatly generated.

Figure 4:
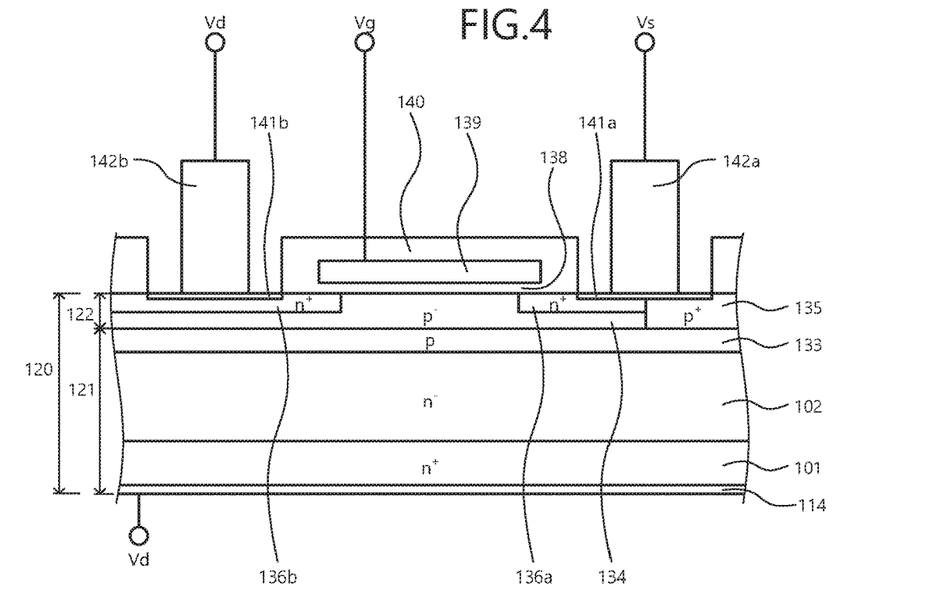
FIG. 4 is a cross-sectional view of a structure of a silicon carbide semiconductor device of a first comparison example.

In the traditional example, at present, it is not clear whether the interface state density of the SiO$_2$/SiC interface being high is a problem specific to the SiO$_2$/SiC interface or occurs from differences of the band structure, the amount of distortion, and the amount of defects of the SiO$_2$/SiC interface. Thus, verification concerning factors causing variation of the gate threshold voltage in the traditional example was performed using a SiC-MOSFET (hereinafter, the first comparison example) in which arrangement of an aluminum wiring layer functioning as a source electrode differs from the traditional example. FIG. 4 is a cross-sectional view of a structure of a silicon carbide semiconductor device of the first comparison example.

The first comparison example depicted in FIG. 4 is a SiC-horizontal MOSFET of a planar gate structure in which aluminum wiring layers 142a, 142b do not contact an interlayer insulating film 140. The first comparison example is a horizontal MOS gate structure of the traditional example. Impurity concentrations and thicknesses, etc. of regions of the first comparison example are the same as the impurity concentrations and thicknesses, etc. of the corresponding regions in the traditional example. Although the horizontal MOSFET does not require the n$^+$-type silicon carbide substrate 101 and the n$^-$-type drift region 102, the horizontal MOSFET is a structure formed concurrently with the traditional example on the same silicon carbide base 120 as the traditional example (FIG. 6).

In particular, in the first comparison example, a p-type base region 133 is provided on the entire surface layer on the p$^-$-type silicon carbide layer 122 side of the n$^-$-type silicon carbide layer 121. A portion of the n$^-$-type silicon carbide layer 121 excluding the p-type base region 133 is the n$^-$-type drift region 102. In the p$^-$-type silicon carbide layer 122, a p$^+$-type contact region 135, an n$^+$-type source region 136a, and an n$^+$-type drain region 136b are selectively provided. The p$^+$-type contact region 135 contacts the n$^+$-type source region 136a. The n$^+$-type drain region 136b is arranged away from the n$^+$-type source region 136a.

A portion of the p$^-$-type silicon carbide layer 122 excluding the p$^+$-type contact region 135, the n$^+$-type source region 136a, and the n$^+$-type drain region 136b is a p$^-$-type base region 134. On a surface of the p$^-$-type base region 134 between the n$^+$-type source region 136a and the n$^+$-type drain region 136b, a gate electrode 139 is provided via a gate insulating film 138. The interlayer insulating film 140 covers the gate electrode 139. An aluminum wiring layer 142a contacts the p$^+$-type contact region 135 and the n$^+$-type source region 136, via a source contact portion 141a.

The aluminum wiring layer 142a and the source contact portion 141a are a metal wiring layer functioning as a source electrode. An aluminum wiring layer 142b contacts the n$^+$-type drain region 136b, via a drain contact portion 141b. The aluminum wiring layer 142b and the drain contact portion 141b are a metal wiring layer functioning as a drain electrode. The aluminum wiring layers 142a, 142b are provided so as not to contact the interlayer insulating film 140 in a contact hole.

In the first comparison example, under a high-temperature operation in which the operating temperature became 200 degrees C., a negative voltage of −3 MV/cm was applied to the gate electrode 139 for 10 minutes and thereafter, gate threshold voltage variation was measured, resulting in a variation range of the gate threshold voltage of ±0.1V or less. From this result, it was found that the gate threshold voltage does not vary when the aluminum wiring layers 142a, 142b and the interlayer insulating film 140 do not contact each other, i.e., when the interlayer insulating film 140 is not covered by the aluminum wiring layers 142a, 142b.

Thus, with respect to the traditional example in which the aluminum wiring layer 112 and the interlayer insulating film 110 contact each other, elemental analysis of an interface of the interlayer insulating film 110 and the aluminum wiring layer 112, and of the aluminum wiring layer 112 was performed by thermal desorption spectroscopy (TDS).

As a result, in the traditional example, when the chip temperature was raised to 200 degrees C. or higher, hydrogen molecules of an impurity concentration of $3\times10^{14}/cm^2$ or higher were detected. Therefore, it is presumed that the generation of hydrogen atoms/hydrogen ions from the interface of the interlayer insulating film 110 and the aluminum wiring layer 112, and from the aluminum wiring layer 112 results from a reaction of the aluminum, which is a construction material of the aluminum wiring layer 112, and the water ($H_2O$) included in the atmosphere at the time of thermal oxidation.

Typically, when a SiC-MOSFET is manufactured, a majority of the hydrogen ions are taken in by the $SiO_2$/SiC interface during oxide film formation at a high temperature of 800 degrees C. or higher or by heat treatment at a high temperature of 800 degrees C. or higher. The hydrogen ions taken into the $SiO_2$/SiC interface by high-temperature heat treatment at 800 degrees C. or higher bond with dangling bonds of the $SiO_2$/SiC interface, forming silicon-hydrogen (Si—H) bonds and carbon-hydrogen (C—H) bonds and becoming immobilized. Hydrogen atoms of the silicon-hydrogen bonds and carbon-hydrogen bonds formed in this manner at the $SiO_2$/SiC interface by high-temperature heat treatment do not change (dissociate) with low-temperature heat treatment at a temperature of 400 degrees C. or lower.

On the other hand, the aluminum wiring layer is formed on the interlayer insulating film by low-temperature heat treatment at a temperature of 400 degrees C. or lower. At the time of formation of the aluminum wiring layer by the low-temperature heat treatment, hydrogen atoms/hydrogen ions generated from the interface of the interlayer insulating film and the aluminum wiring layer or from inside the aluminum wiring layer do not become immobilized. Therefore, under high-temperature operation, when negative voltage is applied to the gate electrode of a SiC-MOSFET, non-immobilized hydrogen atoms/hydrogen ions move to the $SiO_2$/SiC interface. Furthermore, it is presumed that immobilized hydrogen atoms dissociate from the silicon-hydrogen (Si—H) bonds and the carbon-hydrogen (C—H) bonds of the $SiO_2$/SiC interface, creating dangling bonds of the silicon atoms and carbon atoms ($Si^+$, $C^+$), and generating positive charge.

For example, a diffusion coefficient of the hydrogen atoms/hydrogen ions in an oxide film ($SiO_2$ film) at 200 degrees C. is $1.0\times10^{-8} cm^2$/second, and the diffusion distance thereof 24.5μm in 10 minutes. Therefore, in the traditional example, under high-temperature operation, the interface of the interlayer insulating film 110 and the hydrogen atoms/hydrogen ions generated from the aluminum wiring layer 112 or from inside the aluminum wiring layer 112 easily move inside the interlayer insulating film 110, reach the gate insulating film 108, and cause the gate threshold voltage variation. Although manufacture of a SiC-vertical MOSFET of structure in which the interlayer insulating film and the aluminum wiring layer do not contact each other is possible, practical use is difficult because the size of unit cell increases by a gap generated between the aluminum wiring layer and a side wall of the contact hole.

In contrast, in the present invention, as described above, the titanium film 15 is present between the interlayer insulating film 10 and the aluminum wiring layer 12, so as to cover the entire surface of the interlayer insulating film 10. Therefore, hydrogen atoms/hydrogen ions generated from inside the aluminum wiring layer 12 are occluded/obstructed by the titanium film 15. As a result, the hydrogen atoms/hydrogen ions generated from inside the aluminum wiring layer 12 may be prevented from moving to the $SiO_2$/SiC interface and the variation range of the gate threshold voltage may be reduced when negative voltage is applied to the gate electrode 9.

For example, a SiC-vertical MOSFET chip (hereinafter, EXAMPLE) was produced according to the method of manufacturing a silicon carbide semiconductor device of the first embodiment, under various conditions given as an example. In other words, in EXAMPLE, the titanium film 15 having the thickness t11 of 0.1 μm was formed by sputtering and the thickness t1 of the titanium film 15 remaining after heat treatment was 90 nm. In EXAMPLE, under high-temperature operation in which the operating temperature becomes 200 degrees C., a negative voltage of −3 MV/cm was applied to the gate electrode 9 for 1000 hours and the amount of variation of the gate threshold voltage thereafter could be suppressed to ±0.1V or less. Therefore, in the present invention, it was found that a structure in which no gap is generated between the aluminum wiring layer 12 and the side wall of the contact hole is possible and increases in the side of the unit cell could be avoided.

The gate threshold voltage was measured with respect to a SiC-MOSFET (hereinafter, a second comparison example) produced according to the silicon carbide semiconductor device of the first embodiment, under the condition of a substrate temperature of 380 degrees C. at the time of sputtering for forming the titanium film 15 and the aluminum wiring layer 12. As a result, it was confirmed that in the second comparison example, the gate threshold voltage varies. When the aluminum wiring layer of the second comparison example was observed, in part of the region, the TiAl alloy film contacted the source contact portion. Since the concentration of the hydrogen molecules occluded in the TiAl alloy film was extremely low compared to the titanium film, it is presumed that the hydrogen atoms/hydrogen ions moved to the silicon carbide base side through a contact portion of the TiAl alloy film and the source contact portion and caused the gate threshold variation. Therefore, by configuring the TiAl alloy film 16 and the source contact portion 11 to not contact each other as in the present invention, gate threshold variation may be suppressed more assuredly.

In the first embodiment and the first and the second comparison examples, although a case where the front surface of the $n^+$-type silicon carbide substrate 1 is a C plane is described as an example, the inventor confirmed that even when the front surface of the $n^+$-type silicon carbide substrate 1 is a (0001) plane, a so-called Si plane, a SiC-MOSFET having a stable gate threshold voltage may be similarly produced.

Figure 5:
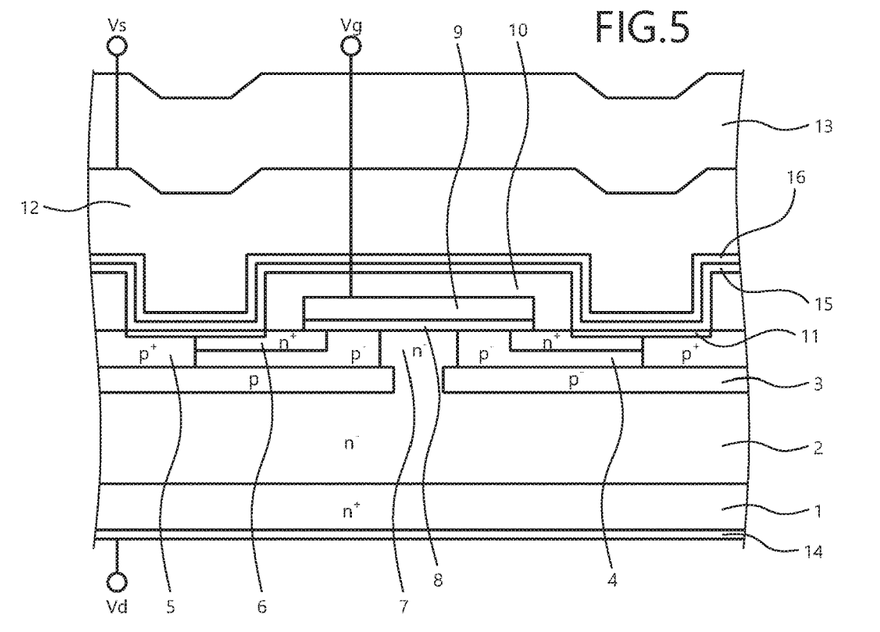
FIG. 5 is a cross-sectional view of a vertical SiC-MOSFET according to a second embodiment.

FIG. 5 is a cross-sectional view of a vertical SiC-MOSFET according to a second embodiment. The method of manufacturing the SiC-MOSFET will be described. First, on the $n^+$-type SiC substrate 1, which is a high-concentration and becomes a drain region of a first conductivity type, a low-concentration $n^-$-type drift layer 2 doped with $5\times10^{15}/cm^3$ of nitrogen is deposited to have a thickness of 10μm.

Next, $p^-$-type layers 3 of a low concentration are formed by ion implantation. Subsequently, on the surface (main surface) of the $n^+$-type SiC substrate 1 ($n^-$-type drift layer 2), low concentration $p^-$-type layers 4 doped with $5\times10^{15}/cm^3$ of aluminum (Al) are deposited to have a thickness of 0.5 μm. The $p^-$-type layers 4 have a lower concentration than the $p^-$-type layers 3, and the $p^-$-type layers 3 and the $p^-$-type layers 4 are a well region of a second conductivity type.

Thereafter, an n⁻-type layer 7 of a low concentration is formed by nitrogen ion implantation.

Next, n⁺-type layers (a source region of the first conductivity type) 6 of a high concentration are formed by phosphorus ion implantation and p⁺-type layers 5 of a high concentration are formed by aluminum (Al) ion implantation. Thereafter, the entire n⁺-type SiC substrate 1 is subject to activation annealing in an argon atmosphere at a temperature of 1600 degrees C.

Subsequently, the gate insulating film 8 is formed on the p⁻-type layers 4, the n⁺-type layers 6, and the n⁻-type layer 7 in an $N_2O$ atmosphere and has a thickness of 70 nm. On the gate insulating film 8, the gate electrode 9 is formed and the interlayer film 10 is formed so as to cover the gate electrode 9. Further, a silicide layer 11 having a predetermined thickness is formed to form an ohmic electrode.

Thereafter, as a source electrode, a 3-layer structure of a titanium (Ti) layer 15/a (titanium aluminum) Ti—Al alloy layer 16/an aluminum (Al) layer 12 is formed. At this time, the Ti layer 15/the Ti—Al alloy layer 16/the Al layer 12 are continuously formed by sputtering to have respective thicknesses of 0.1μm/50 nm/5.0μm. As a sputtering condition, magnetron sputtering in which the temperature of the n⁺-type substrate 1 is 25 degrees C. and the argon pressure is 0.3 Pa may be used.

The thickness of the Ti—Al alloy layer 16 may be preferably 5 nm or more and 100 nm or less; below 5 nm, uniform formation of the Ti—Al alloy layer 16 in the wafer surface becomes difficult and at 100 nm or more, the resistivity of the Ti—Al alloy layer 16 increases, affecting device characteristics.

Composition of the Ti—Al alloy layer 16 and a target composition to be used may be $TiAl_6$, $TiAl_3$, TiAl, or $Ti_3Al$ and, a content of 25 atoms % to 86 atoms % of Al is necessary for forming the Ti—Al alloy layer 16 to suppress the interaction of Ti and Al after annealing. In particular, as commercial sputtering targets, 40 atoms %, 50 atoms %, 64 atoms %, 67 atoms %, 67 atoms %, 70 atoms % of Al is targeted and here, a target including 50 atoms % of Al was used. One reason for use of these intermetallic compounds is that since such compositions exist as intermetallic compounds, the effect of suppressing inter-diffusion is high compared to other compositions.

The Al content is calculated by a calculation method of number of Al atoms/(number of Ti atoms+number of Al atoms)*100.

Further, the source electrode formed by these 3 layers is formed without exposure to the atmosphere in the same chamber to prevent formation of an immutable oxide film or the like at interfaces thereof. Furthermore, the formation of the Ti—Al alloy layer 16 may preferably use sputtering after the purity and uniformity thereof are established.

The temperature of the n⁺-type SiC substrate 1 at the time of sputtering is set to be 25 degrees C. or higher so as not necessitate a cooling mechanism and a temperature of 350 degrees or higher is not desirable because the manufacturing cost of the semiconductor device increases. As for the sputtering pressure, when low, the sputtering rate slows; and when high, distribution in the surface becomes poor and therefore, the sputtering pressure may be preferably 0.1 Pa to 0.8 Pa.

Subsequently, etching of the Al layer 12, etching of the Ti—Al alloy layer 16, and etching of the Ti layer 15 are performed, and the source electrode of the 3-layer structure is formed. The source electrode formed in this manner has a structure in which the Al layer 12 contacts the gate electrode 9/the interlayer film 10, via the Ti layer 15/the Ti—Al alloy layer 16. Thereafter, polyimide that is a protective film 13 is formed, annealing at 380 degrees C. is performed, and the rear electrode 14 is formed as a drain electrode on the rear surface of the n⁺-type SiC substrate 1, completing the vertical SiC-MOSFET.

When a structure of only Ti/Al and in which the Ti—Al alloy layer 16 is not formed, a TiAl alloy layer is formed by polyimide curing or annealing and since this TiAl alloy layer penetrates the underlying Ti, the hydrogen obstructing effect is lost.

On the other hand, when the Ti—Al alloy layer 16 is formed in advance in the second layer as in the second embodiment, there is no generation of new TiAl grains at the interface of the Ti—Al alloy layer 16 of the second layer and the Ti layer 15 of the first layer with 380 degree C. annealing. Further, by the Ti layer 15 beneath the Ti—Al alloy layer 16, hydrogen atoms/hydrogen ions in the Al layer 12 are absorbed by the Ti layer 15 and the diffusion of hydrogen into the gate insulating film 8 is eliminated, enabling formation of the gate insulating film 8 having a stabilized threshold voltage.

The temperature of the polyimide or annealing may be preferably 500 degrees or lower and the when temperature of the polyimide or annealing is this temperature or higher, polymers constituting the polyimide decompose. Further, at a temperature of 300 degrees or less, imidization does not progress and therefore, the role as a protective film is not achieved.

Use of the semiconductor device having the source electrode of the 3-layer structure described above enables the threshold voltage variation range after 1000 hours at a heating temperature of 200 degrees C. and with a gate voltage of −3 MV/cm to be suppressed to 0.1V or less. Further, the Ti layer 15 is a hard material and when 1.0μm more, cracks are generated. The thickness of the Ti layer 15 is set to be 10 nm or more and 1.0μm or less.

For the occlusion effect of hydrogen (H) by Ti, the thickness of the Ti layer 15 after annealing is set to be 10 nm or more. An experiment concerning the occlusion effect of the Ti layer 15 was performed. In the experiment, when hydrogen was injected at 400 degree C. into the Ti layer 15 having a thickness of 100 nm, $6 \times 10^{17}/cm^2$ of $H_2$ was occluded and thus, a thickness of 10 nm would be able to occlude $1 \times 10^{15}/cm^2$ or more hydrogen.

As a third embodiment, a specimen was produced where the polyimide annealing temperature of 380 degrees C. in the second embodiment was raised to 400 degrees C. When the source electrode constituted only the 2 layers of the Ti layer 15 and the Al layer 12, the particle size (thickness) of newly formed TiAl alloy was 30 nm or more and less than 100 nm whereas in the case of forming the source electrode to have the 3-layer structure of the Ti layer 15/the Ti—Al alloy layer 16/the Al layer 12 as in the third embodiment, the thickness of the newly formed Ti—Al alloy layer was 10 nm or less.

In this manner, even in the third embodiment where the annealing temperature was to 400 degrees C., the Ti layer 15 beneath the source electrode remained having a thickness of about 90 nm thereby, enabling favorable device characteristics to be obtained.

Although description has been given taking a SiC-vertical MOSFET as an example, the present invention is applicable to other MOS type silicon carbide semiconductor devices such as SiC-horizontal MOSFETs and SiC-IGBTs, and achieves the same results in such cases. The same effects are further achieved in the case of a trench gate structure in place of a planar gate structure. Further, the p⁻-type base region may be set as a structure formed by ion implantation. In the present invention, for example, although formation of a channel in the (000-1) plane or (0001) plane of a silicon carbide semiconductor (i.e., a C plane or Si plane is set as the chip front surface) is particularly effective, even when a channel is formed in another plane orientation (for example a (11-20) plane, a (03-38) plane, and the like), the same effects are achieved. Further, in each of the embodiments described, for example, dimensions and impurity concentrations of regions, etc. may be variously set according to required specifications. In the embodiments, although the first conductivity type is assumed to be an n-type and the second conductivity type is assumed to be a p-type, the invention is further applicable when the first conductivity type is a p-type and the second conductivity type is an n-type.

Traditionally, securing the reliability of SiC-MOSFETs is demanded in the practical use of SiC-MOSFETs; however, from verification by reliability tests, it is known that the gate threshold voltage (Vth) varies greatly when negative voltage is applied to the gate electrode. A structure in which a titanium (Ti) film is arranged between a source contact portion and an aluminum wiring layer is disclosed in Japanese Laid-Open Patent Publication No. 2012-129503 as a method for solving this problem. However, in Japanese Laid-Open Patent Publication No. 2012-129503, there is a problem in that the gate threshold voltage varies greatly depending on the operating conditions.

Further, in the practical use of the SiC-MOSFETs of the background arts above, ensuring the reliability of the SiC-MOSFETs is a problem. In verifying SiC-MOSFET reliability tests, it was found that there is a problem with the threshold variation with negative bias. Details are explained here.

SiC-MOSFETs have to apply high voltages of both positive voltage and negative voltage to the gate electrode at the time of driving. Further, guaranteed operation at 200 degrees C. is necessary for high-temperature operation. Therefore, guaranteed operation at a temperature of 200 degrees C. and when the electric field strength applied to the gate insulating film is ±2 MV/cm to 4 MV/cm is necessary. In this case, under certain conditions, a phenomenon of the MOS threshold voltage (Vth) greatly varying is observed.

Values in the manufacture of the traditional SiC-MOSFET depicted in FIG. 6 are given. The n⁻-type drift region 102 is deposited to a thickness of 10 μm by doping $5 \times 10^{15}/cm^3$ of nitrogen. The p⁻-type base region 104 is deposited to a thickness of 0.5 μm by doping $5 \times 10^{15}/cm^3$ of aluminum. The n⁺-type source region 106 is formed by phosphorus (P) ion implantation and the p⁺-type contact region 105 is formed by aluminum ion implantation. The entire n⁺-type silicon carbide substrate 101 is subject to activation annealing in an argon atmosphere at 1600 degrees C.

The gate insulating film 108 is formed in an N₂O atmosphere to have a thickness of 70 nm. The aluminum wiring layer 112 that is a source wiring metal is 5 μm and polyimide of the passivation protective film 113 is cured a 380 degrees C.

At a high temperature of 200 degrees C., gate voltages of +3 MV/cm and −3 MV/cm were applied for 10 minutes to the SiC-MOSFET manufactured in the manner above and thereafter, variation of the threshold voltage was measured. As for the results, a phenomenon was observed where although the threshold shift amount with positive voltage application was ±0.1V or less, with negative voltage application, the threshold voltage significantly shifted negatively.

This phenomenon indicates that consequent to application of negative bias to the gate electrode in a high temperature atmosphere, positive fixed charge is generated near the SiO₂/SiC interface or in the SiO₂.

The phenomenon of the threshold voltage shifting negatively indicates that holes that are positive charges are generated at the SiO₂/SiC interface. There are few reports of positive charge being generated at the time of negative bias in silicon (Si) type Si-MOSFETs and Si-IGBT devices.

Further, although a threshold shift phenomenon (slow trap phenomenon) in Si-PMOSs at the time of negative bias has been reported, under the conditions of a gate voltage of −3 MV/cm and a temperature of 150 degrees C., the threshold variation range after 1000 hours is a variation range of 0.1V. In contrast, in the case of a SiC-MOSFET, under the conditions of a gate voltage of −3 MV/cm and a temperature of 150 degrees C., variation is −7V or more, significantly different from the Si-MOS.

The SiO₂/Si interface state density is $1.0 \times 10^{11} cm^{-2} \cdot eV^{-1}$ or less whereas the SiO₂/SiC interface state density is $1.0 \times 10^{12} cm^{-2} \cdot eV^{-1}$ or more, indicating that many hole traps are present at the SiO₂/SiC interface. Although much of the research is in the reduction of the interface state density, there are no reports of an interface state density equal to that of Si/SiO₂.

The SiO₂/SiC interface state density being high is a problem specific to the SiO₂/SiC interface and at present, it is not clear whether the problem occurs based on differences in the defect volume●distortion amount●band structure, etc. of the SiO₂/SiC interface.

Figure 7:
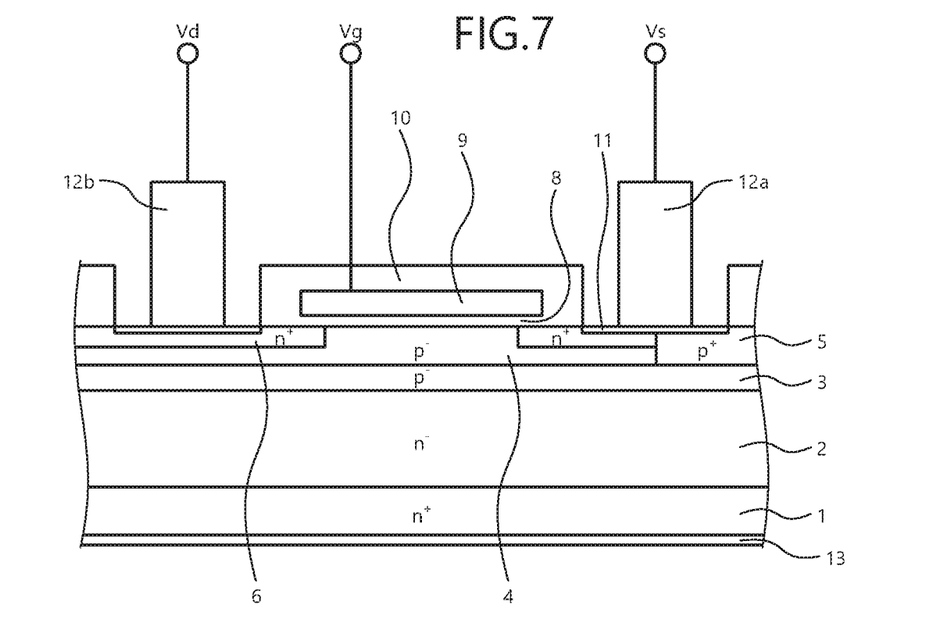
FIG. 7 is a cross-sectional view of another traditional MOSFET.

FIG. 7 is a cross-sectional view of another traditional MOSFET. Next, to investigate factors of the threshold shift, as depicted in FIG. 7, a horizontal MOSFET in which an interlayer film 10 and an Al layer 12 are not directly in contact was prepared and threshold variation was measured.

In the horizontal MOSFET, on the high-concentration n⁺-type SiC substrate 1, the n⁻-type drift layer 2 of a low-concentration and doped with $5 \times 10^{15}/cm^3$ of nitrogen is deposited to have a thickness of 10 μm. Next, the p⁻-type layers 3 of a low concentration are formed by ion implantation. Subsequently, on the surface (main surface) of the n⁺-type SiC substrate 1, the p⁻-type layers 4 of a low concentration and doped with $5 \times 10^{15}/cm^3$ of aluminum are deposited to have a thickness of 0.5 μm. The p⁻-type layers 4 have a lower concentration than the p⁻-type layers 3. Subsequently, the n⁻-type layer 7 of a low concentration is formed by nitrogen ion implantation.

The n⁺-type layers 6 of a high concentration are formed by phosphorus ion implantation and the p⁺-type layers 5 of a high concentration are formed by aluminum ion implantation. Thereafter, activation annealing is performed in an argon atmosphere at 1600 degrees C. Subsequently, the gate insulating film 8 is formed in an N₂O atmosphere to have a thickness of 70 nm. Thereafter, the gate electrode 9 and the interlayer film 10 are formed. Further, the silicide layer 11 is formed to have a thickness of 1.0μm for forming an ohmic electrode.

Subsequently, aluminum (Al) that is a wiring metal is deposited to have a thickness of 5 μm, and a horizontal MOSFET of a structure in which a source electrode Al layer (12a) and a drain electrode Al layer (12b) do not contact the interlayer film 10 is formed. Reference numeral 13 is a rear electrode.

After a gate voltage of −3 MV/cm was applied to the horizontal MOSFET above for 10 minutes at 200 degrees C., the threshold voltage variation was ±0.1V. This result indicates that in the horizontal MOSFET in which the gate electrode 9 does not contact the Al layers 12a, 12b (source electrode, drain electrode) via the interlayer film 10, there is no threshold variation at the time of negative bias.

In the structure where the Al layers 12a, 12b for wiring do not contact the interlayer film 10 in this manner, since there was no threshold variation, elemental analysis of the interlayer film 10/the aluminum layer 12 (source electrode) structure for which the threshold voltage variation was great was analyzed by thermal desorption spectroscopy. In the analysis results, $3 \times 10^{14}/cm^2$ or more hydrogen was detected at a temperature of 200 degrees c or higher. The generation of hydrogen in the Al and from the SiO/Al interface is presumed to result from the reaction of Al and water.

At the $SiO_2$/SiC interface, when an oxide film is formed by a temperature of 800 degrees C. or higher, or by an annealing process at a high temperature of 800 degrees C. or higher, a majority of the hydrogen ions are taken in; however, because of the high-temperature process, the silicon-hydrogen (Si—H) bonds and carbon-hydrogen (C—H) bonds taken in do not change at a low-temperature process of 400 degrees C. or lower.

However, hydrogen atoms/hydrogen ions generated from an AL metal deposited at a low temperature (400 degrees C. or lower) are not immobilized. It is thought that under high-temperature gate voltage application, hydrogen atoms/hydrogen ions generated from the Al move to the $SiO_2$/SiC interface, Si—H bonds and C—H bonds at the $SiO_2$/SiC interface become Si+C+dangling bonds, and positive charge is generated.

The diffusion coefficient of the hydrogen in the oxide film at 200 degrees C. is $1.0 \times 10^{-8} [cm^2/s]$ and the diffusion distance after 10 minutes is 24.5 µm. The hydrogen easily moves in the oxide film, reaches the gate insulating film, and causes threshold variation.

Although the vertical MOSFET in which the source electrode Al layer 12 and the interlayer film 10 are not in contact may be created, the MOS cell size increases and is unusable in terms of practical use.

However, according to the invention above, the source electrode is formed by a 3-layer structure of titanium (Ti)/Ti—Al (titanium aluminum) alloy layer/aluminum (Al). For example, the Ti layer/the Ti-Al alloy layer/the Al layer are formed continuously by sputtering to have respective thicknesses of 0.1 µm/50 nm/5.0 µm and form the source electrode. Sputtering conditions such as magnetron sputtering of a silicon carbide substrate temperature of 25 degrees C., an argon pressure of 0.3 Pa, etc. is used. As a result, by forming the Ti—Al alloy layer as the second layer in advance, for example, with annealing of 380 degrees C., new Ti—Al grains are not generated at the interface of the Ti—Al alloy layer, which is the second layer, and the Ti layer, which is the first layer. Further, by the Ti layer beneath the Ti—Al alloy layer, the hydrogen atoms/hydrogen ions in the Al are absorbed by the Ti layer and diffusion of hydrogen into the gate insulating film is eliminated, enabling formation of the SiC-MOSFET having stabilized threshold voltage. As a result, in a small-type vertical semiconductor element through which current flows from the front surface side of the semiconductor substrate to the rear surface side, threshold variation may be suppressed and electrical characteristics of the semiconductor device may be stabilized.

The silicon carbide semiconductor device and the method of manufacturing a silicon carbide semiconductor device according to the present invention achieve an effect in that a silicon carbide semiconductor device having stabilized electrical characteristics may be provided.

As described, the silicon carbide semiconductor device and the method of manufacturing a silicon carbide semiconductor device according to the present invention are useful in power semiconductor devices used in power supply devices for switching and inverters; and are particularly suitable for small-type vertical semiconductor elements in which current flows from a front surface side of a semiconductor substrate to a rear surface side.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
   a silicon carbide body;
   a contact portion, provided in the silicon carbide body, forming an ohmic contact with the silicon carbide body;
   an insulated gate structure having a gate insulating film that is made of a silicon dioxide and contacts a portion of the silicon carbide body;
   an interlayer insulating film covering the insulated gate structure;
   a first metal film provided on a surface of the contact portion and the interlayer insulating film, the first metal film storing or obstructing hydrogen;
   a metal electrode layer provided on a surface of the first metal film and electrically connected to the portion of the silicon carbide body; and
   a second metal film provided between the first metal film and the metal electrode layer, the second metal film being free of direct contact with the contact portion, wherein
   the contact portion is comprised of a nickel silicide,
   the first metal film is comprised of titanium and is directly provided on surfaces of the contact portion and the interlayer insulating film,
   the metal electrode layer is comprised of aluminum,
   the second metal film is comprised of a metal containing titanium and aluminum, and a grain size of the metal electrode layer is 100 nm or more.

2. The silicon carbide semiconductor device according to claim 1, wherein the first metal film covers the surface of the contact portion and the interlayer insulating film entirely.

3. The silicon carbide semiconductor device according to claim 1, wherein the first metal film has a thickness that is 10 nm to 1.0 µm.

4. The silicon carbide semiconductor device according to claim 1, wherein the first metal film stores hydrogen molecules whose concentration is $1 \times 10^{16}/cm^2$ to $6 \times 10^{18}/cm^2$.

5. The silicon carbide semiconductor device according to claim 1, wherein the second metal film has a thickness of 1 nm to 100 nm.

6. The silicon carbide semiconductor device according to claim 1, wherein
   the silicon carbide body includes:
      a semiconductor substrate containing silicon carbide;
      a first semiconductor region of a first conductivity type and containing silicon carbide, the first semiconductor region being provided on a front surface of the semiconductor substrate and having an impurity concentration that is lower than that of the semiconductor substrate;
      a second semiconductor region of a second conductivity type and containing silicon carbide, the second semiconductor region being provided on a first side of the first semiconductor region opposite a second side, the second side of the first semiconductor region facing the semiconductor substrate; and a third semiconductor region of the first conductivity type and selectively provided in the second semiconductor region;

the gate insulating film is provided contacting a part of the second semiconductor region between the third semiconductor region and first semiconductor region, the insulated gate structure includes a gate electrode, the gate insulating film being disposed between the second semiconductor region and the gate electrode, the metal electrode layer is provided as a first electrode and is electrically connected to the second semiconductor region and the third semiconductor region, and the silicon carbide semiconductor further comprising a second electrode provided on a rear surface of the semiconductor substrate.

7. The silicon carbide semiconductor device according to claim 1, further comprising a source region provided in the silicon carbide body, wherein a part of the contact portion is provided in the source region, and the source region is electrically connected to the metal electrode layer via the contact portion, the first metal film and the second metal film.

8. A semiconductor device, comprising:
a silicon carbide substrate;
a drain region on the silicon carbide substrate and of a first conductivity type;
a well region on the silicon carbide substrate and of a second conductivity type;
a source region on the silicon carbide substrate and of the first conductivity type;
a gate insulating film formed on the silicon carbide substrate;
a gate electrode provided on the gate insulating film;
an interlayer film formed on the gate electrode; and
a source electrode formed directly on the interlayer film and the source region, the source electrode consisting of a 3-layer structure of a titanium (Ti) layer/a titanium aluminum (Ti-Al) alloy layer/an aluminum (Al) layer, the Ti-Al alloy layer having a thickness of 5 nm to 100 nm, the Ti-Al alloy layer having, in an overall content of the Ti and the Al, an Al content of 25 atoms % to 86 atoms %, a grain size of the source electrode being 100 nm or more.

9. The semiconductor device according to claim 8, wherein
the silicon carbide substrate is an n-type,
the semiconductor device comprises:
an n-type drift layer on the silicon carbide substrate;
a p-type well layer provided on the n-type drift layer;
an n-type source region provided in the p-type well layer;
a gate insulating film formed on the p-type well layer;
a gate electrode formed on the gate insulating film;
a source electrode electrically connected to the n-type source region; and
a drain electrode provided on a first surface of the silicon carbide substrate opposite a second surface on which the n-type drift layer is provided.

10. The semiconductor device according to claim 8, wherein the semiconductor device has a MOSFET semiconductor device structure.

11. The semiconductor device according to claim 8, wherein the Ti-Al alloy layer is one of $TiAl_6$, $TiAl_3$, $TiAl$, and $Ti_3Al$.

* * * * *